(12) United States Patent
Zuppero et al.

(10) Patent No.: US 6,916,451 B1
(45) Date of Patent: Jul. 12, 2005

(54) SOLID STATE SURFACE CATALYSIS REACTOR

(75) Inventors: Anthony C. Zuppero, Pollock Pines, CA (US); Jawahar M. Gidwani, San Francisco, CA (US)

(73) Assignee: Neokismet, L.L.C., San Francisco, CA (US)

(*) Notice: Subject to any disclaimer, the term of this patent is extended or adjusted under 35 U.S.C. 154(b) by 954 days.

(21) Appl. No.: 09/631,463

(22) Filed: Aug. 3, 2000

Related U.S. Application Data

(60) Continuation-in-part of application No. 09/589,669, filed on Jun. 7, 2000, now Pat. No. 6,327,859, which is a division of application No. 09/304,979, filed on May 4, 1999, now Pat. No. 6,114,620.

(60) Provisional application No. 60/186,567, filed on Mar. 2, 2000, provisional application No. 60/177,919, filed on Jan. 25, 2000, and provisional application No. 60/160,531, filed on Oct. 20, 1999.

(51) Int. Cl.$^7$ ............. B01J 19/08; H01L 21/00; C25B 5/00
(52) U.S. Cl. ............. 422/186.03; 136/252; 204/156
(58) Field of Search ............. 204/155, 156; 136/252–256; 60/721; 310/300, 10; 422/186.03

(56) References Cited

U.S. PATENT DOCUMENTS

| | | | |
|---|---|---|---|
| 3,925,235 A | | 12/1975 | Lee |
| 5,632,870 A | * | 5/1997 | Kucherov ............. 204/241 |
| 5,674,698 A | * | 10/1997 | Zarling et al. ............. 435/7.92 |

(Continued)

FOREIGN PATENT DOCUMENTS

| | | | |
|---|---|---|---|
| JP | 02157012 A | * | 6/1990 |
| WO | WO 01/28677 A1 | * | 4/2001 |

OTHER PUBLICATIONS

Frese, K. W., Jr. et al., "Hot electron reduction at etched n–Si/Pt thin film electrodes," Journal of the Electrochemical Society, vol. 141, No. 9, Sep. 1994, pp. 2402–2409.

Mahan, G. D. et al., "Multilayer thermionic refrigerator and generator," Journal of Applied Physics, vol. 83, No. 9, May 1, 1998.

Stipe, B. C. et al., "Atomistic studies of 02 dissociation on Pt(111) induced by photons, electrons, and by heating," J. of Chem. Phys., vol. 107 (16), Oct. 22, 1997, pp. 6443–6447.

Tripa, C. E. et al., "Surface–aligned reaction of photogenerated oxygen atoms with carbon monoxide targets," Nature, vol. 398, Apr. 15, 1999, pp. 591–593.

Bonn, M. et al., "Phonon–Versus Electron–Mediated Desorption and Oxidation of CO on Ru(0001)," Science, vol. 285, No. 5430, Issue of Aug. 13, 1999, pp. 1042–1045.

(Continued)

*Primary Examiner*—Kiley Stoner
(74) *Attorney, Agent, or Firm*—Baker & McKenzie LLP

(57) ABSTRACT

A method and apparatus to stimulate chemical reactions on a catalyst surface using electricity, and the reverse process to convert energy released from chemical reactions into electricity. A reversible emitter generates electrons which are injected into reactants on the catalyst surface, exciting chemically reactive vibrational resonances. Hot electrons created in the emitter region of a semiconductor junction diffuse to the co-located collector region and catalyst surface. Catalyst clusters or films bonded on the collector surface transfer the hot electrons to or from the catalyst surface having adsorbed reactants. The dimension of the catalyst-collector is less than the energy mean free path of hot electrons. The hot electrons excite reactant vibrations before thermalizing with the substrate lattice thereby accelerating reactions. The hot electrons are also generated by the same reactions on a catalyst surface. The method and apparatus is reversible and may be operated as an electric generator using chemical reactions.

156 Claims, 4 Drawing Sheets

U.S. PATENT DOCUMENTS

| | | | | |
|---|---|---|---|---|
| 5,698,397 | A | * 12/1997 | Zarling et al. | 435/6 |
| 5,736,410 | A | * 4/1998 | Zarling et al. | 436/172 |
| 5,763,189 | A | * 6/1998 | Buechler et al. | 435/7.1 |
| 5,891,656 | A | * 4/1999 | Zarling et al. | 435/7.92 |
| 6,114,620 | A | 9/2000 | Zuppero et al. | |
| 6,159,686 | A | * 12/2000 | Kardos et al. | 435/6 |
| 6,218,608 | B1 | * 4/2001 | Zuppero et al. | 136/253 |
| 6,222,116 | B1 | * 4/2001 | Zuppero et al. | 136/253 |
| 6,238,931 | B1 | * 5/2001 | Buechler et al. | 436/546 |
| 6,251,687 | B1 | * 6/2001 | Buechler et al. | 436/518 |
| 6,268,560 | B1 | * 7/2001 | Zuppero et al. | 136/253 |
| 6,312,914 | B1 | * 11/2001 | Kardos et al. | 435/6 |
| 6,327,859 | B1 | * 12/2001 | Zuppero et al. | 60/721 |
| 6,399,397 | B1 | * 6/2002 | Zarling et al. | 436/518 |
| 6,444,476 | B1 | * 9/2002 | Morgan | 436/172 |
| 6,537,829 | B1 | * 3/2003 | Zarling et al. | 436/514 |
| 6,649,823 | B2 | * 11/2003 | Zuppero et al. | 136/252 |
| 6,700,056 | B2 | * 3/2004 | Zuppero et al. | 136/252 |
| 2001/0018923 | A1 | * 9/2001 | Zuppero et al. | 136/248 |
| 2002/0017827 | A1 | * 2/2002 | Zuperro et al. | 310/300 |
| 2002/0045190 | A1 | * 4/2002 | Wilson et al. | 435/7.1 |
| 2002/0070632 | A1 | * 6/2002 | Zuppero et al. | 310/301 |
| 2002/0121088 | A1 | * 9/2002 | Zuppero et al. | 60/532 |
| 2003/0000570 | A1 | * 1/2003 | Zuppero et al. | 136/252 |
| 2003/0019517 | A1 | * 1/2003 | McFarland | 136/256 |
| 2003/0030067 | A1 | * 2/2003 | Chen | 257/102 |
| 2003/0100119 | A1 | * 5/2003 | Weinberg et al. | 436/37 |
| 2003/0166307 | A1 | * 9/2003 | Zuppero et al. | 438/9 |
| 2003/0207331 | A1 | * 11/2003 | Wilson et al. | 435/7.1 |

OTHER PUBLICATIONS

Davis, J. E. et al., "Kinetics and dynamics of the dissociative chemisorption of oxygen on Ir(111)," J. Chem. Phys., 107 No. 3, Jul. 15, 1997, pp. 943–951.

Gadzuk, J. W., "Hot–electron femtochemistry at surfaces: on the role of multiple electron processes in desorption," Chemical Physics, vol. 251, year 2000, pp. 87–97.

Gadzuk, J. W., "Resonance–assisted hot electron femtochemistry at surfaces," Physical Review Letters, May 27, 1996, vol. 76, Issue 22, pp. 4234–4237.

Ge, N.–H. et al., "Femtosecond Dynamics of Electron Localization at Interfaces," Science, vol. 279, No. 5348, Issue of Jan. 9, 1998, pp. 202–205.

Gao, Shiwu, "Quantum kinetic theory of vibrational heating and bond breaking by hot electrons," Physical Review B, vol. 55, No. 3, Jan. 15, 1997–I, pp. 1876–1886.

Hou, H. et al., "Enhanced Reactivity of Highly Vibrationally Excited Molecules on Metal Surfaces," Science, vol. 284, No. 5420, Issue of Jun. 4, 1999, pp. 1647–1650.

Nienhaus, H. et al., "Direct detection of electron hole pairs generated by chemical reactions on metal surfaces," Surface Science 445 (2000) pp. 335–342.

Nienhaus, H. et al., "Selective H atom sensors using ultrathin Ag/Si Schottky diodes," Applied Physics Letters, Jun. 28, 1999, vol. 74, Issue 26, pp. 4046–4048.

Gaillard, Frederic et al., "Hot electron generation in aqueous solution at oxide–covered tantalum electrodes. Reduction of methylpyridinium and electrogenerated chemiluminescence of Ru (bpy) 32+," Journal of Physical Chemistry B., vol. 103, No. 4, Jan. 28, 1999, pp. 667–674.

Engstrom, Ulrika and Ryberg, Roger, "Comparing the vibrational properties of low–energy modes of a molecular and an atomic adsorbate: CO and O on Pt (111)," Journal Of Chemical Physics, vol. 112, No. 4, Jan. 22, 2000, pp. 1959–1965.

Nolan, P. D. et al., "Molecularly chemisorbed intermediates to oxygen adsorption on Pt ( 111 ): A molecular beam and electron energy–loss spectroscopy study," Journal Of Chemical Physics, vol. 111, No. 8, Aug. 22, 1999.

Nolan P. D. et al., "Direct verification of a high–translational–energy molecular precursor to oxygen dissociation on Pd(111)," Surface Science vol. 419, pp. L107–L113, Dec. 24, 1998.

Otto, Andreas et al., "Role of atomic scale roughness in hot electron chemistry," Journal of Physical Chemistry B, vol. 103, No. 14. Apr. 8, 1999, pp. 2696–2701.

Plihal, M. et al., "Role of intra–adsorbate Coulomb correlations in energy transfer at metal surfaces," Physical Review B, vol. 58, No. 4, Jul. 15, 1998, pp. 2192–2206.

Sung, Yung–Eun et al., "Enhancement of electrochemical hot electron injection into electrolyte solutions at oxide–covered tantalum electrodes by thin platinum films," Journal of Physical Chemistry B., vol. 102, No. 49, Dec. 3, 1998, pp. 9806–9811.

Zhdanov, V. P. et al., "Substrate–mediated photoinduced chemical reactions on ultrathin metal films," Surface Science, vol. 432 (#3), pp. L599–L603, Jul. 20, 1999.

Nienhaus, H., "Electron–hole pair creation by reactions at metal surfaces," American Physical Society, Centennial Meeting Program, Mar. 20–26, 1999, Atlanta, GA, Session SC33—Metal Surfaces: Adsorbates. http://www.aps.org/meet/CENT99/BAPS/.

Nienhaus, H et al., "Electron–Hole Pair Creation at Ag and Cu Surfaces by Adsorption of Atomic Hydrogen and Deuterium," Physical Review Letters, vol. 82, Issue 2, Jan. 11, 1999, pp. 446–449.

Diesing, D. et al., "Aluminium oxide tunnel junctions: influence of preparation technique, sample geometry and oxide thickness," Thin Solid Films, 342 (1999), pp. 282–290, received Feb. 26, 1998; accepted Sep. 11, 1998.

Agranovich, V. M. et al., "New concept for organic LEDs: non–radiative electronic energy transfer from semiconductor quantum well to organic overlayer", Elsevier Science, Synthetic Metals, 2001, vol. 116, pp. 349–351.

* cited by examiner

SOLID STATE SURFACE CATALYSIS REACTOR

CROSS-REFERENCE TO RELATED APPLICATIONS

This application is a continuation-in-part of commonly-assigned and U.S. patent application Ser. No.: 09/589,669 filed on Jun. 7, 2000, now U.S. Pat. No. 6,327,859 which is a divisional application of U.S. patent application Ser. No. 09/304,979 filed on May 4, 1999, now U.S. Pat. No. 6,114,620 and claims the benefit of the U.S. Provisional Patent Application No. 60/186,567 filed on Mar. 2, 2000, U.S. Provisional Patent Application No. 60/160,531 filed on Oct. 20, 1999, U.S. Provisional Patent Application No.: 60/177,919 filed on Jan. 25, 2000.

TECHNICAL FIELD OF THE INVENTION

The present invention relates generally to a reaction stimulator and energy converter.

BACKGROUND OF THE INVENTION

Recent experimental and theoretical developments in surface science showed how hot electrons cause heating of the vibration of molecules or atoms adsorbed on a catalyst surface. The energy of hot electrons is defined as electrons with effective temperatures between 600 Kelvin and 60,000 Kelvin, which means equivalent energies between 0.05 and approximately 5 eV, or many times that of thermal energy at room temperature. 300 degrees Kelvin is 0.026 eV.

It has been discovered that hot electrons that diffuse to a catalyst metal surface interact strongly with the adsorbed surface chemicals, also called adsorbates, and can do so at a rate faster than the process of electrons thermalizing with the lattice of catalyst metal atoms. It has also been recently discovered that the adsorbates acquire vibrational energy when interacting with hot electrons from the catalyst surface. It has been further discovered that adsorbate vibrational energy strongly enhances the rate of chemical reactions, and in some cases enable reactions that do not occur by thermal means because of the activation energies or chemical thermodynamics involved. Hot electrons stimulate adsorbate chemical reactions on a catalyst surface. The reverse of this process has also been observed, where a surface chemical reaction resulted in the production of hot electrons.

The presence of hot electrons on the surface of the catalyst can cause a pseudo-thermal regime in which the surface vibrations of adsorbate molecules, either against themselves or against the catalyst, are in equilibrium with the temperature of the substrate hot electrons rather than with the physical temperature of the substrate itself. This means the vibrations can be at several thousand degrees while the catalyst is at ambient temperature. Hot electrons excite the adsorbate from the bottom of its adsorption well in a stepwise manner, and may even do so until it overcomes the adsorption barrier and hops to a neighboring potential well, reacts or desorbs.

The hot electron energy or frequency need not exactly match that of the adsorbates. The adsorbate excitation structure is generally very broad, being spread over many frequencies, and the mechanism is often via an electronic excited state. That is, when the adsorbate acquires an electron it transitions to an excited electronic state. Within a few tens of femtoseconds it begins to move outward away from the surface, and then releases the electron. The adsorbate now transitions back to a non-electronic excited state. However, it retains the extra energy given to it by the hot electron. As a result, the adsorbate is in a higher vibration state. The tens of femtosecond lifetime for the process causes a broadband resonance feature and hence permits an energy mismatch between hot electron and the receiving adsorbate energy levels. The substrate electron in effect deposits energy into a vibration mode of adsorbate reactant, such as the vibration of the atoms in the adsorbate reactant molecule or in the vibration of the adsorbate against the catalyst surface. This process can repeat itself many times, to the point where the adsorbate desorbs. In the literature this is called "Desorption Induced by (Multiple) Electronic Transitions," Abbreviated DIMET or DIET. This is the stimulator process.

The generator process works in reverse. An adsorbate with energy in one of its vibration modes attracts and acquires a cold electron from the catalyst. This causes a transition where the adsorbate with attached electron then becomes a charged adsorbate specie in an excited electron state. Within femtoseconds this specie in the excited electron state decays and ejects an electron. This leaves the adsorbate reactant with less energy in its vibration mode and the electron with excess kinetic energy. The effect is that the energetically excited reactant on the surface of the catalyst gave a fraction of its energy to an electron in the catalyst. This is the generator process.

This generator or reverse process has been observed in laboratories. The detector in this observation used a short circuit Schottky diode to measure an electron flux directly generated by the surface reactions. The laboratory detector measured a current in a short circuit diode, which means the detector generated almost exactly zero power. However, the detector confirmed the existence of the generator mode. Both hot electrons and hot holes were observed, and with energies in excess of the Schottky barrier in silicon, which is of order 0.5 eV.

Hot electrons on a catalyst surface have been shown to accelerate reactions. Experiments with vibrationally excited Nitrogen Oxide (NO) molecules interacting with a copper (Cu) surface showed thousand-fold enhancement of surface reactivity. Up to near unit reaction probability was observed. In that work, neither reactant translational energy nor surface temperature had a strong effect on the reaction probability, confirming the efficacy of using hot electrons.

In another experiment, carbon monoxide (CO) was oxidized on a ruthenium surface. A 1.5 eV, 110 femtosecond laser pulse duration created the hot electrons. It was observed that sub-picosecond reactions of adsorbed O with CO to produce $CO_2$ in a reaction that is energetically not possible at all without the hot electrons. This means if one uses thermal energy alone, CO will desorb without reacting.

The efficiency of such hot electrons to impart vibrational energy to just the adsorbates can approach 100%. Nearly 100% desorption of CO from a copper surface was observed. A three order of magnitude increase in reaction rate of NO with Cu was also observed.

This establishes the strong, two way energy transfer between hot electrons and excited adsorbate specie on a metal catalyst surface. The collection of observations leads to both an apparatus and method to couple the excitation structures of the adsorbate reactants adsorbed, chemisorbed or physisorbed on a catalyst surface to the excitation structure of a semiconductor diode in close proximity to the adsorbates.

The semiconductor diode excitation structure is rather simple, consisting of holes in the valence band and electrons in the conduction band. The excitation structure of the chemically reactive adsorbate-catalyst system is dominated by vibrations of the atoms and molecules with themselves and against the substrate, forming energy level bands, and the energy level bands due to electronic excited states of these specie, where the adsorbates may acquire a transient or permanent charge.

Coupling of these structures occurs mainly by two paths, either directly through the direct, typically ballistic transport of the hot carriers such as hot electrons or hot holes, between adsorbate and semiconductor, or by resonant tunneling of energy. Resonant tunneling couples the two structures through oscillating electric fields produced by the excitation structures in the semiconductor and adsorbate-catalyst system. The coupling is greatly enhanced when the frequencies of the excitations on either side are close to each other.

Hot electrons are the easiest excitation to work with. The current method of choice to produce and inject the hot electrons into a metal catalyst surface relies on a pulsed laser. The usual method to produce these hot electrons is to irradiate the surface of the metal with a short laser pulse, typically with pulse duration in the range of 50 to 1000 femtoseconds and with photon energies of 1 eV or greater (0.2 to 1.5 micron wavelength). The photons are adsorbed and produce electrons with energies between 0 eV and up to the photon energy, splitting the energy with a hot hole, and with hot electron energies averaging approximately half the incident photon energy. A laser, however, is one of the most expensive energy sources available.

A theory to use solid state metal-insulator-metal junctions to produce resonantly coupled, hot electrons has been proposed. The theoretical suggestion would produce resonance-assisted, hot-electron-induced femto-second chemical processing at surfaces. The energies relative to the catalyst Fermi level and associated with the metal-insulator junctions is higher than what is now known to be appropriate for surface resonances. No experiments using this theory are known at this time. No known mention of process reversibility has been claimed.

The use of a neutral semiconductor substrate as the injection mechanism into thin metal overlayers, with photons derived from a pulsed laser as the creator of hot carriers in the semiconductor, was also suggested in the literature. It was suggested that this could be an order of magnitude more efficient for stimulating gas-surface catalytic reactions than using the metal as the photon acceptor. It was suggested that using a semiconductor substrate, metal overlayer and catalyst device to produce hot electrons more efficiently with photons and inject them into a catalyst surface. However, process efficiency needed to render the approach useful was not adequately addressed. One must tailor the Schottky junction, the ohmic junction or the almost ohmic junction between the semiconductor and the metal so that the coupling of either hot carriers such as hot electrons or holes is electrically efficient, or so that the resonant tunneling is efficient. The proper use of resonant tunneling and resonance-assisted processes can be valuable components in a useful device and method.

A Schottky junction diode has been used in experiments for hot electron injection into solutions. One of the co-authors of that work suggests that they did not achieve the success they wanted because the surface states associated with the electrolyte cooled the electrons. A catalyst electrode Schottky junction made of n-silicon and platinum metal was used to inject electrons into a reactive electrolyte solution. The platinum thickness was varied from less than the mean free path to several times thicker than the mean free path of hot electrons in platinum. They achieved some success, and also suffered severe problems with interactions between hot electrons and electrolyte. Flooding the surface with liquid electrolyte destroys the effectiveness of hot electrons. Metal-oxide junction surface states have been an unsolved problem with this approach, where liquids flood the reactive surface.

It is now known that outer layers, away from the catalyst surface, of multiple layers of adsorbates that accumulate on the metal-liquid interface trap hot electrons as "polaritons" and render them less useful as a source of prompt reaction stimulators or as generators of excitations. The efficacy of a semiconductor substrate under a metal and catalyst reactive surface is a valuable element. A semiconductor diode is a critical element.

Implicit in all the observations is the efficiency of pulsed operation. In the case of a reaction stimulator, the duration of the pulses generating hot electrons is less than the time associated with electron thermalization with the lattice. In the case of a generator, the sudden burst of chemical reactions causes a flood of hot electrons on the catalyst surface. This in turn causes a flood of electrons in the conduction band of the semiconductor substrate collecting those hot electrons. A sufficiently short burst causes the number of generated electrons to exceed the thermally occurring short circuit electrons, thereby increasing the efficiency of the generation of electricity.

Missing in the public domain are methods to tailor the surface of the catalyst to enhance resonant tunneling, to enhance the activation of selected energy bands, to enhance the probability of desired energy transitions, or to enhance the selected reaction pathways.

SUMMARY OF THE INVENTION

The present disclosure, in one embodiment, is directed to a method and apparatus to couple the excitation structure of a semiconductor substrate to the excitation structure of reactive adsorbates on the surface of a catalyst. The coupling is then used to stimulate reactions and to extract energy from the reactions.

In one embodiment, the method and apparatus injects energy such as hot electrons, from a substrate, into a catalyst, and through the catalyst to the catalyst surface. At the same time, reactants are conveyed to the catalyst surface from a gas phase in contact with the surface. The reactants adsorb on to the catalyst surface and become adsorbates.

In an exemplary embodiment of the present disclosure, hot electrons constitute the injected energy. The method and apparatus of the present disclosure uses the hot electron energy to initiate, to control and/or to drive reactions of the adsorbates. Reaction products react, desorb and/or diffuse on or away from the catalyst surface.

The method of injecting energy such as hot electrons into adsorbates may have the unique result of driving reactions that cannot be driven by the use of heat energy alone. The products of the driven reactions may themselves constitute the desired reaction product.

This mode of operation may also include causing and tailoring reactions in the volume of a gas phase in contact with the surface as well as on the surface of the substrate, by using desorbed products. The products of the driven reactions can be used to drive and control other reactions.

In one embodiment, the method and apparatus of the present disclosure may use two-terminal devices such as semiconductor diodes to inject hot electrons. The method and apparatus may also include using a conducting catalyst to form one of the terminals. The thickness of the conducting catalyst terminal is formed to be sufficiently thin to permit the transport of useful number of the hot electrons to the reactive surface of the catalyst.

In another embodiment, the method and apparatus of the present disclosure may use chemical reactions on or near a second surface to generate hot electrons. The method and apparatus may include transporting the hot electrons to the catalyst surface containing adsorbates.

The second surface may be in contact with a substrate, which is in turn in contact with the catalyst surface. This mode of operation and its variants are referred to as the stimulator mode.

The method and apparatus of the present disclosure may operate in reverse, where reactions of adsorbates on or near the catalyst surface release energy that is collected into a useful form. One form of energy is hot electrons which travel into the catalyst, through the catalyst and into a substrate. Other forms of energy may include electromagnetic radiation. This mode of operation and its variants are referred to as the generator mode. The method and apparatus to couple excitation structures, in one embodiment, includes operating in both modes at the same time.

The method and apparatus of the present disclosure may use hot holes instead of hot electrons, referring to either hot holes or hot electrons as hot carriers and also as energetic excitations.

In one embodiment, the method and apparatus in the stimulator mode includes stimulating reactions that comprise creating hot carriers and injecting them into the catalyst. For example, the method and apparatus in one embodiment uses a two terminal device such as a forward biased p-n junction diode or a Schottky diode to create hot electrons. Diode electrons flow in the direction of the forward bias. An electron starts at the terminal biased negative on the back side of a substrate semiconductor. It travels through the semiconductor and out of the semiconductor into the positively biased part of the diode.

When the electron transitions to the positive part of a p-n junction diode, it becomes a minority carrier with energy approximately equal to the band gap energy and is therefore "hot." When the electron transitions to the positive part of a Schottky junction diode, which is a conductor, the electron has approximately the forward bias energy, and is also therefore "hot."

If the positively biased terminal and the positive part of the diode are thick relative to the energy mean free path of the hot electron, then the hot electron may loose energy in the positively biased regions and the energy may be lost to heat. This typically occurs within tens of femtoseconds and within tens of nanometers in a metal. The method and apparatus, in one embodiment, thus includes forming the positively biased parts and terminal of the diode to be thin, thin relative to the energy mean free path of the hot electron.

When the positively biased terminal of the diode is in direct contact with a metal catalyst that is also thin relative to the energy mean free path of the hot electron, the hot electron passes from the diode, through the positively biased terminal of the diode, through the catalyst and on to the surface of the catalyst. The method and apparatus, in one embodiment, thus includes forming a suitably thin catalyst in direct contact with the positively biased parts and terminal of the diode.

When hot electrons are driven onto the surface of the catalyst, adsorbates on the catalyst can be stimulated to react. Reactions may occur within picoseconds of the appearance of the hot electrons. Some reactions may go to 80% completion less than a picosecond.

When the surface of the catalyst is in contact with a liquid, the hot electrons may dissipate into the liquid, greatly diminishing their ability to cause reactions. The method and apparatus, in one embodiment, thus includes providing a gas phase, rather than a liquid phase, in contact with the catalyst.

Generally, the excitation structure of a semiconductor substrate is represented by its energy levels. The valence and conduction bands are such energy levels. The energy levels of a quantum well are such energy levels. Excitations may include minority carriers, hot carriers, coupling electric fields associated with electromagnetic cavities, excitons, and plasmons. The excitation structure of reactive adsorbates on the surface of a catalyst may include excited reactant molecular vibrations, molecule-surface vibrations, atom-surface vibrations, adsorption reactions, chemical reactions, excited electronic states, and the energy levels of the adsorbate-substrate system.

The method and apparatus when operated in the stimulator mode, in one embodiment, uses electrical or other forms of energy input to the semiconductor substrate to, for example, manipulate the reaction path of the adsorbates so as to accelerate reactions, to steer the reactions, to manipulate the forms of energy produced by the reaction, and to alter the temperature needed to stimulate surface catalytic reactions.

The method and apparatus when operated in the generator mode, in one embodiment, converts excitation energy of the chemical reaction associated with the adsorbate-catalyst system into electricity or other forms of energy in the semiconductor substrate.

When operated in the stimulator-generator combined mode, the method and apparatus, in one embodiment, may use electricity or other forms of energy to manipulate reactions and at the same time may generate electricity or other forms of energy using the chemical reaction energy released by the adsorbate-catalyst system.

In one embodiment, the method and apparatus of the present disclosure in the stimulator-generator mode uses a p-n junction to create hot electrons and inject the hot electrons into thin metal overlayer structures that may include catalyst material. By conveying the hot electrons to adsorbates on the catalyst surface the method stimulates a reaction that can, for example, create an abundance of autocatalyst reactants on the catalyst surface.

An example of such an autocatalyst is the OH, hydroxyl radical. The autocatalysts cause an avalanche of further stimulated reactions on or near the catalyst surface. These reactions create hot electrons in the catalyst. The same p-n junction diode may collect the hot electrons forward biasing it and hence generating electricity. In another embodiment, a Schottky diode may be similarly used.

In one embodiment, when the method and apparatus of the present disclosure is operated in the generator mode, excitation energy originating in a catalyst-adsorbate system is coupled into semiconductor band gap excitations, which can typically cause a forward bias in the semiconductor and generate electricity or other useful forms of energy.

The catalyst surface and the positively biased terminal may include a catalyst, an optional underlayer, and optional reaction accelerator-decelerator materials. A surface of the catalyst and of the optional reaction accelerator-decelerator materials comes in intimate contact with the reactant chemicals in one embodiment.

Various regions of a device using the method and apparatus of the present disclosure may include various and different catalysts, various different, hot carrier emitters and various modes of energy coupling, and may include electromagnetic coupling, plasmon coupling, ballistic transport and resonant tunneling.

Further features and advantages of the present invention as well as the structure and operation of various embodiments of the present invention are described in detail below with reference to the accompanying drawings. In the drawings, like reference numbers indicate identical or functionally similar elements.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENT OF THE INVENTION

Figure 1:
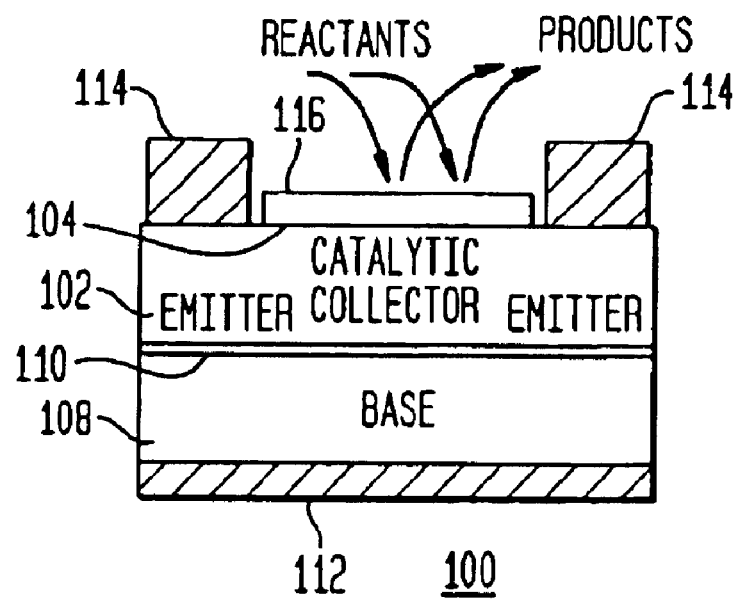
FIG. 1 shows a general schematic cross section of a solid state surface catalysis reactor device of the present invention in one embodiment.

In one embodiment, the method and apparatus of the present disclosure uses hot electron energy to initiate and or simulate chemical reactions which would otherwise not occur by thermal processes alone. The non-thermal, hot electron energy tailors reaction paths between adsorbates and gas reactants interacting with a catalyst surface. One source of hot electrons is the reaction of fuel and oxidizer on a catalyst structures. Another source uses two terminal electrical devices in contact with the catalyst surface. Electricity can be generated using the same method and device from the pulsed reactions stimulated by hot electron injection. In one embodiment, the method and apparatus couples the excitation structure of a semiconductor substrate to the excitation structure of reactive adsorbates on the surface of a catalyst, The coupling is used, in one embodiment, to stimulate reactions and/or to convert chemical energy into a useful form.

In one embodiment, the method and apparatus of the present disclosure uses electrons as the hot carriers and a p-n junction diode as the semiconductor diode. The base, or substrate, is n type semiconductor and the emitter of the hot electrons is p type semiconductor. A forward bias on the p-n junction diode injects minority carrier electrons into the conduction band of the p type region where they become minority carriers. The minority carriers diffuse and migrate to the catalytic excitation collector and may also be resonantly coupled into the excitation structure of the adsorbate-catalyst system, for example, if the distance from the junction to the catalytic excitation collector is less than several times the diffusion length of minority carriers in the p type semiconductor. For example, when InSb, InAs, or some alloy of InGaAsSb is the semiconductor, then the diffusion length can range from approximately 100 nanometers to several microns.

According to an embodiment of the method and apparatus of this disclosure, the minority carrier electrons are injected or resonantly coupled into the catalyst with an energy in excess of the Fermi level of the catalyst. This excess energy is nearly mono-energetic and has a value approximately equal to the forward bias on the diode. When the semiconductor is a p-n junction diode, the minority carrier energy may be within approximately several kT of the semiconductor band gap energy (kT=thermal energy, 0.026 eV). When the semiconductor diode is a Schottky junction the carrier energy may be within approximately several kT of the energy needed to overcome the Schottky barrier. The hot electrons, may rapidly permeate on to a surface of the catalyst facing and in intimate contact with reactants it, for example, the distance from the p type semiconductor to the surface in contact with the reactants is less than the several times the energy mean free path of electrons in the catalytic excitation collector.

When the catalyst is a metal such as platinum, palladium, rhodium or ruthenium the energy mean free path ranges between 5 and 50 nanometers. When the underlayer is copper or gold the energy mean free path ranges between 50 and 200 nanometers.

When the catalyst is a metal such as platinum, palladium, rhodium or ruthenium the energy mean free path ranges typically between 5 and 50 nanometers. When the underlayer is copper or gold the energy mean free path ranges typically between 10 and 200 nanometers.

The flux of hot electrons interacting with the reactant chemicals is approximately that of the diode forward current if the distance from the catalytic excitation collector to the diode junction is within the diffusion length of the emitter semiconductor and energy mean free path lengths of the catalyst and underlayer, as specified herein.

Another aspect of the present invention uses a Schottky diode. Typical Schottky diode barriers are 0.5 eV and above. For example, when an unacceptably diode barrier forms between desired conductors and semiconductor, a Schottky diode designed to have an effective low barrier height, also referred to as a tunneling junction, may be used. Such a device is constructed by choosing the doping between the metal and the semiconductor of the Schottky junction to be intermediate between the very high doping used to make an almost ohmic junction, typical for making electrical contacts with the semiconductor, and the medium doping used to make a normal Schottky diode. The doping controls the width of the depletion region and hence the strength of the Schottky barrier. The value of the doping may be chosen between degenerate or high doping and conventional or moderate doping, depending on the application.

When the semiconductor is silicon and the metal is any metal associated with the catalytic excitation collector then the doping may be adjusted to an effective value of order 0.1 eV. High doping in silicon yields effectively 0.0 eV barrier and normal doping yields barriers typically between 0.5 and 1.5 eV barrier. This tunneling junction Schottky diode permits the use of common semiconductor materials such as silicon. The use of such a diode is appropriate for use in the generator mode where reactions are pulsed.

With the methods and apparatus provided in either the p-n junction diode or the Schottky junction embodiment of the present invention, the semiconductor diode injects hot carriers or resonantly couples the carriers and with energy approximately equal to the energy of the diode forward bias voltage into the adsorbates on a surface of the catalyst. With the methods and apparatus provided in this invention, the energy of the injected electrons may be chosen by the user so as to steer reactions and to drive reactions in selected modes or pathways, including reaction paths inaccessible to thermal processes.

In another embodiment, the method and apparatus of the present disclosure may be reversible. For example, the inverse of the stimulation process is the collection of electrons generated by adsorbates reacting on the catalytic excitation collector and the resonant coupling of energy into the semiconductor diode, creating carriers such as conduction band electrons or valence band holes. The catalyst, one embodiment, acts like a collector of hot electrons generated by adsorbate chemical reaction energy. In one embodiment, the catalyst, for example, a conducting catalyst, couples excitations from the adsorbates to the semiconductor, instead of from the semiconductor to the adsorbates. The p-type region of the semiconductor gets its hot carriers from the catalyst instead of from the n-type region of the semiconductor. The hot carriers in the p-type region may be excited by resonant coupling of energy from the excitation structure of the adsorbate-catalyst system. The hot carriers migrate into the diode junction towards the n-type semiconductor base. In so doing, the hot electrons maintain a forward bias on the diode, thereby generating electricity. This reversible nature permits the device to generate electricity as a direct result of chemical reactions. This is a generator mode.

This same device may operate both in a stimulator and generator mode simultaneously, and thereby generate electricity more efficiently than operation in the generator mode alone. Operated in this way, the stimulator apparatus triggers and stimulates adsorbate reactions by the application of electricity or other forms of energy to the semiconductor diode. This initiates and causes the reactions to complete in a short time, for example, in the order of picoseconds. The burst of reactions result in a high peak power burst of chemical reactions, with concomitant release of electrons. The resulting flood of electrons may then be collected, thereby generating electricity. The resulting electrons may also stimulate more chemical reactions and may initiate a chain reaction analogous to an explosion or detonation. The result is a form of surface explosion. The electrons may then generate electricity much more efficiently in the semiconductor diode. The electric generating efficiency of a diode is a strong function of the peak power, and the stimulator may create a condition where the reactions achieve such high power.

Energy may be collected in any manner including by operating the solid state surface catalytic reactor in the generator mode. Other modes of collecting energy include but are not limited to collecting radiations-emanating from reactions that have been stimulated, or by collecting heat, or by collecting the reaction products themselves, or by capturing the kinetic energy of the products as they desorb, or by collecting the phonons, or by stimulating and collecting coherent acoustic or optical radiation, or by stimulation of piezoelectric devices.

When the device is operated in the generator mode, stimulation may be achieved in any manner, including by operating the solid state surface catalytic reactor in the generator mode. Other modes of stimulation include but are not limited to stimulation using pulsed laser light, a simple light flash, or the hot carriers generated on other regions of the device by other reactions whose energy outputs may include hot carriers and other catalytic products that stimulate reactions.

With the p-n junction semiconductor in the present invention, semiconductors with band gaps starting from approximately 0.05 eV to 5 eV may be used with room temperature heat sink operation, and band gaps less than 0.05 eV may be used when the system is operated at lower than room temperature. This does not preclude using materials with higher bandgaps, such as insulators like CaF2 with 12 eV bandgap, or any other material with higher bandgap. In particular, the commonly used InSb and InGaAsSb materials have band gaps that may be continuously chosen in the range 0.1 to 1.5 eV by suitable choice of the In/Ga ratio and the As/Sb ratio. The resulting ranges of band gaps lie precisely in the range of energies associated with hydrocarbon chemical bonds. The InSb material produces 0.18 eV electrons, which is ideal for favoring reaction stimulation Vs desorption, because higher energy electrons may stimulate an undesirable large fraction of desorptions, as opposed to surface reactions.

The p-n junction embodiment of this invention provides a substrate whose energy levels match the excited state energy levels of the adsorbates. This greatly enhances resonant transfers, in either direction, that is, to or from the adsorbate. The metals of the catalytic excitation collector provide a resonant tunneling coupling, for example, via plasmons, between the adsorbate and the semiconductor substrate. The resonant tunneling coupling effectively connects the energy band structure of the substrate to the energy band structure of the adsorbates. An ohmic or almost ohmic junction between the catalyst and the semiconductor effectively pins the Fermi level of the catalyst to the valence band of the semiconductor. The lower edge of the conduction band of the semiconductor, being higher than the valence band by an amount equal to the band gap of the semiconductor, in one embodiment is above the Fermi level of the catalyst by the same amount, namely the band gap energy. Since the bandgap may be chosen from a palate between 0.05 to 5 eV, the bandgap energy may be made to match nearly any energy level of the system having the adsorbate and the catalytic excitation collector. By choosing the semiconductor band gap to match the energy level of an adsorbate on the catalytic excitation collector, one may effectively couple the two together through the well known and commonly used process of resonant tunneling. Resonant tunneling greatly increases the cross section for the transfer of energy.

This is useful in the stimulator mode to steer reactions because selected energy levels of the adsorbate may be resonantly activated by hot carriers coming from the semiconductor. This is useful in the generator mode because excited vibration states of adsorbates may be coupled resonantly to the semiconductor, enhancing energy transfer. This is useful in the stimulator-generator mode because the stimulator can trigger and initiate adsorbate reactions, using a relatively small stimulator energy, and the reactions may then spread in a manner analogous to an explosion or detonation on the surface catalytic excitation collector exposed to reactants, which release hot carriers. The hot carriers may then generate electricity at a rate faster than they loose energy by generating heat.

In one embodiment, hot carrier emitters are fabricated using degeneratively doped or highly doped p-n junctions. In this embodiment, the switching speed can approach that of the Schottky junction because of the high carrier densities, and also because the high semiconductor doping densities form abrupt junctions, similar to that of a Schottky diode. High switching speed enhances the ability to pulse the stimulator and cause high peak power reactions. Next, the p-n junction may provide lower energy hot carriers, as low as 0.05 ev and certainly below 0.4 eV, and determined by the chosen bandgap. The p-n- junction may provide very high energy monochromatic hot carriers, with energies equal to the semiconductor band gap, which exceed 5 eV for known devices. The p-n junction provides a much longer diffusion dimension than that of the Schottky junction, between 200 nanometers and several microns, over which the hot carrier can migrate and interact with surface catalysts, permitting much larger and manufacturable semiconductor devices. Further, highly doped or degeneratively doped semiconductor junctions may be produced with nearly ohmic contacts, mitigating the surface state problems.

Another novel aspect of the present invention is the co-location of both an electrically powered reaction stimulator and its inverse, a reaction driven electric generator. The stimulation causes a high rate of reaction, resulting in high peak power which in turn makes the energy generator more efficient.

In another novel aspect, the present invention allows the device to act as both stimulator and generator. The uses of combined reaction stimulation include: 1) controlling catalytic reactions; 2) monitoring those reactions using the generated electrical signal; 3) accelerating reactions on catalysts that have undesirable slow reaction rates but highly desirable selectivity; 4) causing non-thermal steering of reaction paths; 5) stimulating extremely rapid surface chain reactions to achieve high peak power while maintaining low average power; 6) causing chemical reaction temperatures like that of the hot carriers in the catalyst, which may be far in excess of the catalyst physical temperature; 7) in the stimulator-generator mode, using one type of stimulator to pulse the device to make electricity and another type to cause a self cleaning of the device, for example to remove unwanted chemical byproduct that may build up and accumulate with use, 8) initiating reaction avalanches such that the chemical reactions create their own hot carriers, forcing hot carriers to diffuse in the reverse direction, and causing the device to be an electric generator.

As described hereinabove, the present invention is directed to various aspects of the methods and devices that stimulate and manipulate chemical reactions using electrical energy input on selected catalyst surfaces, and that produce electrical energy through an inverse process.

For example, the present invention is directed to a method and apparatus for making a device that will generate hot carriers, especially hot electrons, transport them and couple them to reactant adsorbates on a catalyst surface and cause such adsorbates to acquire an effective vibrational temperature in excess of the temperature of the catalytic surface. Such an effective vibrational temperature in turn accelerates the reaction rates on the catalyst. Excited vibrational states of atomic and molecular adsorbates, both against the catalyst surface and internal to the adsorbates, are observed to be orders of magnitude more reactive than adsorbates in ground states. The methods and apparatus of the present invention increase adsorbate vibrational energy or temperature using an electrical stimulus without appreciably increasing the substrate thermal energy or temperature.

In another aspect, the present invention is directed to methods and apparatus for reversing the above-described process, wherein one or more excitation energies, electrons or holes generated by chemical reactions described herein above are coupled into a semiconductor substrate and converted into electricity.

In another aspect, the present invention is directed to methods and apparatus for a reaction stimulator—generator that efficiently collects energetic carriers generated by reactions on a catalyst surface, particularly hot electrons, and causes them to charge a forward biased diode through an emitter-base junction, thereby generating electricity.

In another aspect, the present invention is directed to a reaction stimulator that injects hot carriers or hot electrons with the range of energies needed to selectively favor desired types of surface chemical reactions.

In another aspect, the present invention is directed to a reaction stimulator that is reversible, wherein the diffusion of hot carriers may proceed in either direction, that is, either from a chemical adsorbate reaction to a hot carrier emitter, which generates electricity, or from a hot carrier emitter to a chemical adsorbate, which uses electricity to stimulate reactions.

In yet another aspect, the present invention uses the heat of vaporization of a reactant as a coolant for the operation of the semiconductor junction.

The method also includes forming metal clusters, layers, atomically uniform monolayers, surface structures, crystalline layers or 1, 2 or 3 dimensional quantum confinement structures such as quantum dots, quantum stadia, quantum corrals and quantum wells from materials comprising the catalyst. The method includes using such layers and quantum confinement structures to tailor the density of electron and hole states of the materials, which in turn cause favorable conditions for the formation of or reaction with hot carriers. Such conditions include depletion of the number of electrons available for the decay of vibrational energies of the adsorbate-substrate system with values of transition energy less than that of the bandgap of the substrate.

The method and apparatus of the present disclosure in one embodiment includes a surface catalyst reactor with tailored electron density of states and tailored energy decay modes. For example, the electron density of states may be modified by forming ordered, electron-reflective or hole-reflective structures of material on the catalyst surface exposed to reactants.

The method in one embodiment includes tailoring the carrier density of states near the Fermi surface of the catalyst so as to enhance the probability of forming electron-hole pairs with the desired energy distributions and for enhancing stimulation of resonant tunneling coupling of vibration states of the adsorbate-substrate system. Such tailoring may include forming and tailoring of the hot electron Fabrey-Pérot modes of a thin-film electron interferometer.

The electron density of states may also be modified by forming electron interferometer structures using catalyst and other substrate materials to form structures to cause multiple path reflections of electrons including but not limited to steps, channels, stadia, corrals, pyramids, polygons, valleys, walls, periodic reflectors, and chaotic reflectors.

The method also may include using combinations of different catalyst materials and of optional reaction accelerator-decelerator materials as part of the catalytic excitation collector, and of forming such materials in any geometry, including but not limited to pillars, islands, clusters, interdigital and random structures and stripes.

The method also may include choosing catalyst and optimal accelerator-decelerator materials that delay or retard reactions of adsorbates, so that use of the stimulation mode may better control the reaction rates. Such materials may be part of the catalyst itself, adjacent to the catalyst, and may be expendables carried by the fuel—oxidizer mixture.

The method also may include choosing catalyst materials with Debye frequency lower than that of the desired hot carrier energy, to enhance the probability that the hot electron will interact with the adsorbate rather than with the phonon vibrations of the catalyst.

The shape of the device may fit contours specified by the user because the basic shape is determined by elements that are only limited in thickness by the dimensions of the semiconductor and in length and breadth by the ability to cut or form parts, which limitations permit component dimensions with less than 10 microns. This permits device contouring to nearly any macroscopic physical shape.

The method in one embodiment also includes using an optional underlayer material as part of the catalytic excitation collector. The underlayer may be a metal such as copper, gold, silver or aluminum, and is chosen to be compatible with obtaining the desired properties with the semiconductor component of the hot carrier emitter. One desired property is an ohmic or almost ohmic junction. The underlayer may be used as an electrical connection in the hot carrier emitter and may also be used as an electrical connection to the catalytic excitation collector. The underlayer may be used as a substrate upon which to fabricate catalyst structures, more underlayers or specified geometries and crystal orientations of materials deposited as part of the catalyst, or to tailor the lattice constants of materials deposited on the underlayer.

The method also includes limiting the thickness of the underlayer to less than several energy mean free paths of the hot carrier chosen for the device. For example, any underlayer may be between one monolayer (approximately 0.3 nanometers) and 50 nanometers when the underlayer metal includes but is not limited to platinum, nickel, palladium, rhodium, rhenium, copper, gold, silver or aluminum.

The method includes enclosing all or selected components of the device in an optical cavity tuned to an energy associated with the excitation structure of the semiconductor, or of the catalytic excitation collector or of the adsorbates or of some combination of these elements.

An apparatus to stimulate reactions or to generate electricity according to one embodiment of the present disclosure includes a hot emitter and catalyst surface. The apparatus in one embodiment may include an optional optical cavity tuned to a desired energy level transition of either the excitation structure of the semiconductor or of the system including the catalyst and chemical adsorbate. Such cavities may include and are not limited to metal and dielectric microcavities, periodic structures that exhibit photonic band gap properties, fabrey-perot cavities, textured mirrors, distributed Bragg reflectors, single and coupled semiconductor microcavities, external cavities with a wavelength filter or a large dispersion, quantum dot vertical cavities, microdisk cavities, quantum dot microdisk cavities, laser waveguides with or without cladding, dielectric slab waveguides, cavities associated electromagnetic surface waves, also called surface plasmons, at a metal-semiconductor interface where no additional confinement layer is needed, chaotic resonators, optical resonators with deformed cross section, resonator designs that incorporate chaotic ray motion, and symmetric resonators with whispering-gallery modes.

In one embodiment, the hot carriers are electrons, the diode is a p-n junction made of InSb with n type base and p type emitter and the catalytic excitation collector is located or co-located in the proximity of the emitter electrical contact. The catalyst ensemble includes a catalyst metal such as any alloy of platinum and palladium and deposited in a surface structure, cluster or quantum confined structure. The configuration or geometry of the catalyst, for example, is such that the distance to the semiconductor from regions of catalyst exposed to adsorbates is predominantly less than 3 times the energy mean free path in platinum, which mean free path is approximately 10 nm. The catalyst metal is in direct contact with the semiconductor of the emitter, which semiconductor is degeneratively doped to form an ohmic or tunneling junction. In this embodiment, the p-n junction is formed a distance from the catalytic excitation collector that is less than 3 times the diffusion distance for electrons in the conduction band of p type InSb, which diffusion distance may be as little as 200 nanometers. The device may be operated in the stimulator mode, the generator mode or the stimulator-generator mode, and where the hot electrons may be created either by the chemical adsorbate reactions or by electrical energy input to the semiconductor diode.

FIG. 1 illustrates a general schematic cross section of a solid state surface catalysis reactor device, in one embodiment. The device 100 comprises an hot carrier emitter 102 and a catalytic excitation collector 104, formed on a base 108. A semiconductor p-n junction 110 is formed between the hot carrier emitter 102 and the base 108. An electrical connection 114 and catalytic excitation collector of hot electrons 104 are arranged as shown in FIG. 1. A base electrical connection 112 is also arranged in contact with the base 108 as shown in FIG. 1. Reactants and products interact on the catalyst surface 116 of the catalytic excitation collector 104. The reactants may include but are not limited to three hydrocarbon chains, ethane, ethylene, propane, propylene, propene, butane, butene, cetane, isomers thereof.

In the stimulation mode, the device 100 utilizes electrical energy to create energetic carriers, also referred to as hot carriers or hot electrons. The hot carriers diffuse into the catalytic excitation collector 104, interact strongly with reactants on the catalyst surface 116 and accelerate the reactions to produce reaction products. The stimulated reactions may cause a chain reaction or the equivalent of a surface explosion. The stimulated reactions may also cause an autocatalyzed chain reaction.

In the generation mode, the hot electrons, generated by chemical reactions occurring on the catalyst surface 116 and diffusing across the junction 110, for example, a p-n junction, cause a forward bias across the junction and generate electrical energy.

In one embodiment, a p-n junction with p type emitter and n-type base is forward biased to create hot electrons. Alternatively, the junction may be a Schottky junction with a metal hot carrier emitter and n-type semiconductor base.

In the stimulation mode, the forward biased junction 110 creates hot electrons. For example, when the base contact 112 is biased negative and the emitter contact 114 is biased positive, hot electrons are created in the junction 110. The hot electrons diffuse through the emitter 102 and ballistically transport through the catalytic excitation collector 104 to the catalyst surface 116.

In the generator mode, hot electrons originating on the catalyst surface 116 may also ballistically transport through the catalytic excitation collector 104 and diffuse to the junction 110, causing the emitter-base junction diode 110 to become forward biased The diode then may become an electricity source instead of a sink.

In one embodiment, the distance from the diode junction 110 to the adsorbates on the surface of the catalyst 116 is formed to be less than the distance over which the energy of hot electrons degrades. This distance is generally less than several times the energy mean free path of such energetic hot electrons when evaluated over the path from the emitter-base junction 110 to the adsorbates on the catalyst surface 116.

Using the process described herein above, reactants adsorbing on the catalyst surfaces become vibrationally and/or electronically excited by the hot electrons, which excitation accelerates the reaction and forms products.

In one embodiment of the present disclosure, the catalytic excitation collector 104 includes catalyst materials in layers, clusters, atomically uniform monolayers, or surface structures. Preferably, the layers or clusters have thickness dimension less than several times the total energy mean free path of hot electrons in the catalyst. The layers or clusters are formed close enough to the diode junction 110 such that hot electrons may diffuse directly between the junction 110 and the catalyst surface 116.

The total energy mean free path of hot electrons in catalysts such as platinum or palladium is of order 10 nanometers and is shorter than in Au, Ag or Cu. Therefore, according to an exemplary embodiment, catalyst clusters or layers are fabricated with cluster, layer thickness or thickness dimension less than this smaller value. For example, the electron energy lifetime has been measured in Tantalum, a representative transition metal electronically similar to the platinum group, and is of order 15 fs. The calculated lifetime in palladium based on the Fermi inverse square scaling would be 600 fs at 0.3 eV and giving a total energy mean free path of 840 nanometers. Instead of this optimistic large value, it is presumed the lifetime is as poor as that measured in tantalum. This gives a total energy mean free path in platinum or palladium of order 21 nanometers. In this embodiment, the catalyst dimension is less than the measured energy mean free path of the hot electrons. These arguments concerning the total thickness of an underlayer, which is the electrical connection to the catalyst, and the catalyst, are only to assert that the path taken by the hot carrier through such catalyst and underlayer shall not be so long as to significantly degrade the hot carrier energy, and any dimension satisfying this condition is acceptable.

In one embodiment, some reactions in the method and apparatus of the present disclosure may occur before thermal desorption occurs. In one embodiment, the methods provided generate electrons that have energies in the range that favor reaction over desorption. These energies are in the range 0.05 to 0.4 eV. Similarly, the method to collect electrons generated by chemical reactions on the catalyst surfaces collect electrons whose energies are also in the range of 0.05 to 0.4 eV. Accordingly, a semiconductor material with band gap less than approximately 0.4 eV may be used. Examples of such semiconductor material include indium antimonide (InSb) or indium arsenide (InAs) which have band gaps of 0.18 eV and 0.35 eV, respectively. Many semiconductor alloys provide acceptable bandgap energies.

The energetic electrons produced with these semiconductors have energy approximately equal to the band gap in the p type semiconductor emitter. Hot electrons diffusing back into the n-type base generate electric potentials whose magnitude approaches the band gap energy. The method of the present disclosure may include choosing the value of the band gap based on the nature of the reactants and the energies associated with their surface activity.

Figure 2:
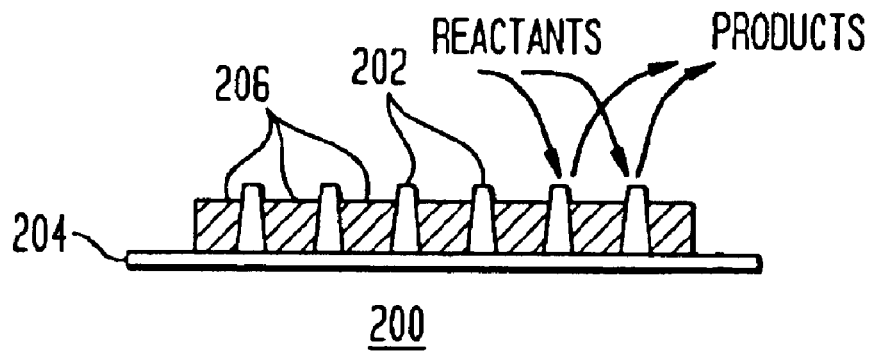
FIG. 2 illustrates a cross section of a catalytic excitation collector in one embodiment of the present invention.

In one embodiment, the catalyst clusters may further include activators, de-activators, decelerator or accelerators placed in their proximity, such as oxides or other materials, as shown in cross section in FIG. 2. FIG. 2 illustrates a cross section 200 of a catalytic excitation collector including reaction accelerator-decelerator materials 206 adjacent to and co-located with the catalyst materials 202. As shown, the hot electron catalytic excitation collector includes the catalyst materials 202, an optional thin electrode underlayer 204, and reaction accelerator-decelerator materials 206 such as oxides. For example, oxides of the catalyst itself, of cerium, titanium or aluminum may be formed between the catalysts islands or layers. The total dimension of the catalyst 202 and thin electrode underlayer 204 is preferably less than several times the total energy mean free path of a hot electron.

Figure 3:
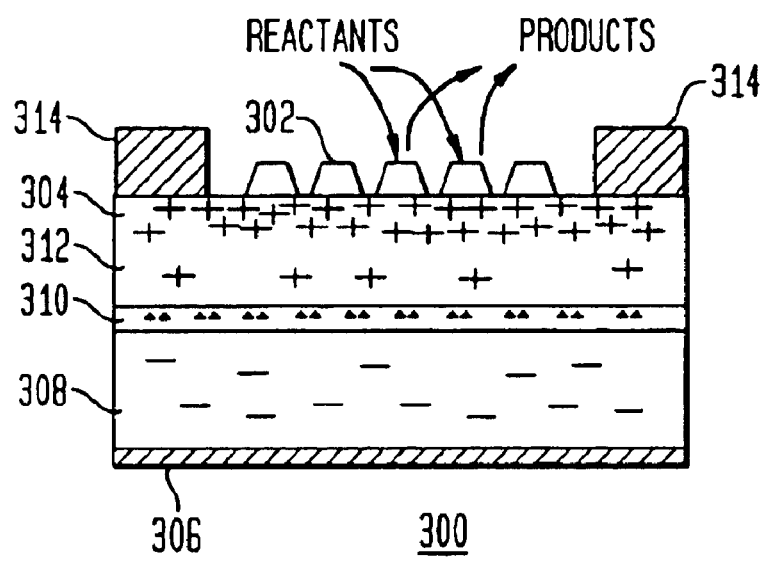
FIG. 3 shows a cross section of a reaction stimulator device with catalyst clusters forming the catalytic excitation collector.
Figure 4:
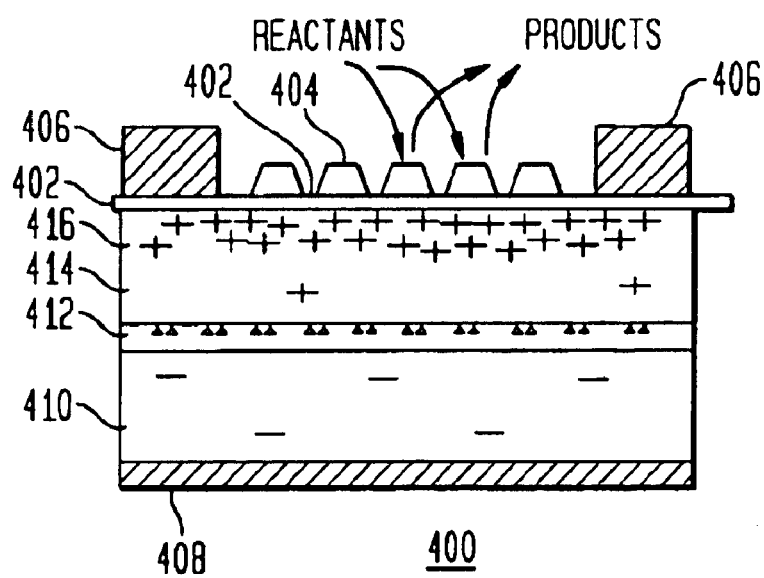
FIG. 4 shows a cross section of a solid state surface catalysis reactor device with a thin electrode forming a substrate for catalyst clusters as part of a catalytic excitation collector and also forming the electrical connection for the hot carrier emitter.
Figure 5:
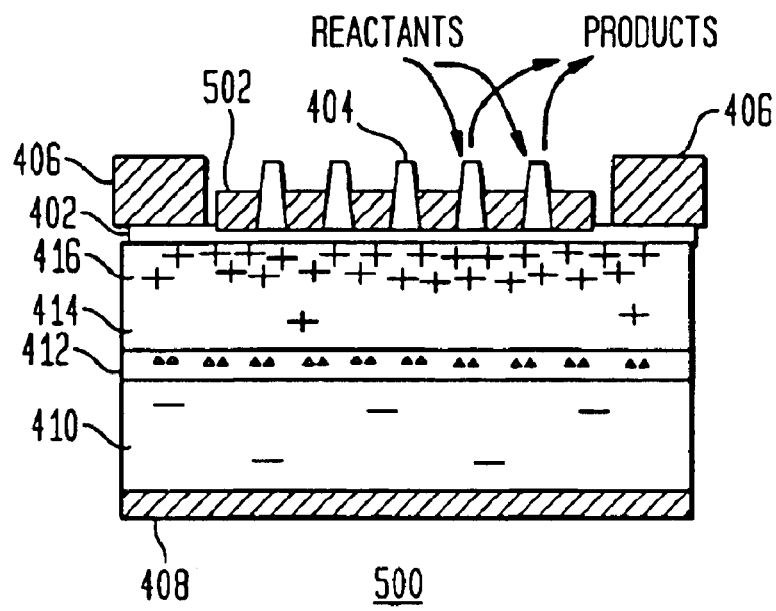
FIG. 5 illustrates a cross section of a solid state surface catalysis reactor with reaction accelerator-decelerator materials surrounding or adjacent to catalyst metal.

FIGS. 3, 4, and 5 illustrate several different embodiments of the catalytic excitation collector used in a solid state surface catalysis reactor. As shown in the Figures, the catalytic excitation collector may include catalyst material such as islands 302 that reside directly on the semiconductor (FIG. 3), or of catalysts 404 on a thin electrode underlayer 402 (FIG. 4) which also forms the electrical connection for the hot carrier emitter 414, or catalysts 404 (FIG. 5) with reaction accelerator-decelerator materials 502 surrounding or adjacent to the catalysts, all residing on a thin electrode underlayer 402 which also forms the electrical connection for the hot carrier emitter 414.

The catalyst may include materials such as Au, Ag, Pt, Pd, Cu, In, Fe, Ni, Sn, and Mo. The catalyst may be formed into structures including metal clusters, pillars, islands, layers, crystalline layers, atomically uniform monolayers, interdigital and random structures, stripes, or surface structures. The catalyst may also be formed into one, two, or three dimensional quantum confinement structures such as quantum dots, quantum stadia, quantum corrals and quantum wells.

FIG. 3 shows a cross section 300 of the solid state surface catalysis reactor device where the hot carrier is an electron. The catalytic excitation collector ensemble 302 includes catalyst islands 302, preferably formed such that the distance to the semiconductor 304 is less than the three times the total energy mean free path of the hot electron in the catalyst 302. The catalyst islands 302 are bonded directly to the p doped or heavily p doped, p+ region of the semiconductor 304. In one embodiment, the catalyst materials 302 are spread over the surface of the semiconductor. In another embodiment, the catalyst is formed with surface structures containing atomically uniform monolayers.

The emitter of hot electrons includes the semiconductor diode formed by negative electrode 306 in contact with n type semiconductor 308, p type semiconductor 312, p-n junction 310 formed between the n type semiconductor 308 and the p type semiconductor 312, p doped or heavily p doped p+ semiconductor 304, and positive electrode 314.

FIG. 4 illustrates a cross section 400 of a solid state surface catalysis reactor device with thin electrode 402 forming a substrate for catalyst structures. In this embodiment, the catalytic excitation collector includes a thin electrode underlayer 402, catalyst structures 404 and a bus bar electrical connection 406 in electrical contact with the thin electrode underlayer 402. The hot electron emitter includes a semiconductor diode formed by negative electrical connection 408, n-type semiconductor 410, p-n junction 412, p type semiconductor, 414, p doped or heavily p doped p+ semiconductor 416, and thin electrode underlayer 402. As shown, the thin electrode underlayer 402 may be common to the hot electron emitter and the catalytic excitation collector. The thin electrode underlayer 402 may be a thin positive electrode. The thin electrode underlayer 402 is preferably selected from those materials that make an ohmic or almost ohmic junction to the semiconductor.

The thin electrode underlayer 402 provided in the present invention forms ohmic or almost ohmic junctions to the semiconductor 416 while also providing a path for hot electrons to enter or leave the catalyst 404. With some selection of combinations of catalyst metal and semiconductor, the ohmic properties of the junction between the semiconductor 416 and catalyst 404 may form a Schottky junction instead. In cases where a Schottky junction is formed, a layer of metal, i.e., the thin electrode underlayer 402 is used as the means to form a practically ohmic junction, which may be almost ohmic or a tunneling Schottky junction. The catalyst clusters or layers 404 are then placed on top of the thin electrode underlayer metal 402. In an exemplary embodiment, the thickness of the electrode underlayer 402 is selected to be much less than the energy mean free path of the hot electrons passing through it.

For hot electrons that have 0.3 eV energy and that will come in contact with commonly used contact metals such as silver ("Ag"), gold ("Au"), and copper ("Cu"), the electron energy lifetime exceeds 200 femtoseconds and the electron velocity is of order 1.4e6 meters/second. The resulting energy mean free path is therefore of order 280 nanometers. This permits the underlayer electrical contact to the semiconductor to be an order of magnitude thicker than the catalytic excitation collector and enhances manufacturability. Thin, 1 to 5 nanometer ("nm") layers of Au, Ag and Cu conductors are routinely fabricated on semiconductors, permitting a thin layer to form the ohmic or almost ohmic contact with semiconductor. This thin layer, e.g., the thin electrode 402, assures that the Fermi level of the catalyst and the Fermi level of the p type semiconductor emitter are the same or practically the same. In this embodiment, a thin, 1 to 20 nm layer of metal such as Au, Ag or Cu may be used as the electrode 402 or substrate for the catalyst ensemble. It should further be appreciated that the present invention does not limit the choice of contact metal used to form the electrode to Au, Ag or Cu, and other metals, alloys or semi-metals may be selected to form at least a nearly ohmic junction with the semiconductor.

For the embodiment in which the hot electron emitter includes a heavily doped semiconductor, for example as shown in 304 of FIG. 3 and in 416 of FIG. 4, the material used for the thin electrode 402 may be selected so that the junction between the electrode 402 and the heavily doped semiconductor 416 forms at least an almost ohmic junction. Preferably, the junction formed is an ohmic junction. To form an ohmic junction or an almost ohmic junction, the semiconductor doping is selected sufficiently high so that the dimension or thickness of any Schottky barrier formed by this junction is sufficiently small that electron tunneling dominates the current flow. Accordingly, the p type semiconductor may be heavily or degeneratively doped near the region of contact with the metal. Such heavy doping occurs when the dopant concentration exceeds approximately 1e18 per cubic centimeter. FIG. 3 shows this heavily doped region 304 near both the emitter electrical connection 314 and catalyst clusters 302. FIG. 4 shows this heavily doped region 416 in contact with the thin electrode underlayer 402.

As an example, a preferred doping of 2e19 per cc donors in InSb or InAs is considered to be such a heavy doping. Degenerative doping of the semiconductor to 2e20 per cc and bonding a suitable metal, such as Au, Ag, or Cu, as the thin metal contact can make an almost ohmic electrical connection to the semiconductor. Nearly any metal may form such an almost ohmic junction because the junction dimension under heavy or degenerative doping is of order 1 nanometer or less, and at this dimension tunneling across the junction is predominating. A junction of this type typically has characteristic p-n junction dimension of order 3 nanometers or less and electron diffusion length in the emitter and collector regions in excess of 1 micron. The dimension may be limited by Auger recombination. Therefore, the junction between the emitter and the catalytic excitation collector elements of the present invention can be readily constructed since 0.1 micron thickness and greater dimension is routinely achieved in practice.

The thin electrode is bonded to the p type semiconductor surface. The catalyst clusters or layers are placed on the thin electrode and preferably near to the p-n junction. "Near" is defined to be "a distance that is within the diffusion dimension of minority carriers in the emitter semiconductor." This dimension is typically of order 0.1 micron or more. The calculated diffusion length of electrons in p type InSb doped to 2e20 per cc is of order 7 microns and 5.5 microns in InAs. However, observed Auger lifetimes of 1 picosecond suggest the diffusion length is of order 1 micron. As will be appreciated by those skilled in the art, this dimension is well within current manufacturing state of the art. Accordingly, the catalyst metal 302 and 404 or the thin metal contact underlayer 402 may serve as both the catalytic excitation collector and an emitter positive electrical connection. This also reduces the cost and complexity of fabrication.

The thin electrode is bonded to the p type semiconductor surface. The catalyst clusters or layers are placed on the thin electrode and preferably near to the p-n junction. "Near" is defined to be "a distance that is within the diffusion dimension of minority carriers in the emitter semiconductor." This dimension is typically of order 0.1 micron or more. The calculated diffusion length of electrons in p type InSb doped to 2e20 per cc is of order 7 microns and 5.5 microns in InAs. However, observed Auger lifetimes of 1 picosecond suggest the diffusion length is of order 1 micron. As will be appreciated by those skilled in the art, this dimension is well within current manufacturing state of the art. Accordinly, the catalyst metal 302 and 404 or the thin metal contact underlayer 402 may serve as both the catalyic excitation collector and an emitter positive electrical connection. This also reduces the cost and complexity of fabrication.

FIG. 5 shows a cross section 500 of a solid state surface catalysis reactor device similar to that illustrated in FIG. 4 and with reaction accelerator-decelerator materials 502 surrounding or adjacent to catalyst structures 404. As described with reference to FIG. 2, in an exemplary embodiment, the catalyst clusters may further include chemical surface reaction activators, accelerators or decelerators placed in their proximity, such as oxides or other materials. As shown, the catalytic excitation collector includes the catalyst structures 404, an optional thin electrode underlayer 402, and catalyst accelerators or decelerators 502 such as oxides. For example, oxides of the catalyst itself, or oxides of cerium, titanium or aluminum may be formed between the catalyst islands or layer. The distance a hot electron must travel through the catalyst 404 and thin electrode underlayer 402 is preferably less that several times the total energy mean free path.

Figure 6:
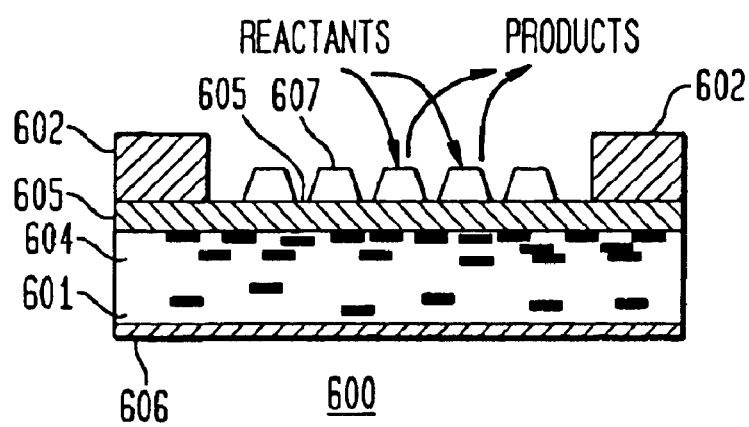
FIG. 6 illustrates a cross section of the solid state surface catalysis reactor having a single metal element that is at the same time an electrical connection to the emitter, the underlayer of the catalytic excitation collector and forming the metal element of a Schottky diode.

Shown in FIG. 6 is a solid state surface catalysis reactor device using a Schottky diode. Reactants adsorb on the catalytic excitation collector 605 and 607. A Schottky diode is formed between the thin metal underlayer 605, the more heavily doped semiconductor 604 shown as n type for illustration appropriate for the hot carrier being hot electrons, the lesser doped semiconductor region 601, and the thicker negative electrical connection 606. Bus bar 602 provides the electrical connection for the current-carrying, positive, thin electrode 605. In operation, the diode is pulsed with a forward bias, that is, electrode 606 is pulsed negative with respect to positive electrode 605, consuming electric power. This triggers surface reactions on the catalyst ensemble 607 and causes products to be formed.

Excess reaction energy may cause the device to operate in generator mode. Here, excess hot electrons produced by the reactions may produce a burst of hot electrons which travel through the thin catalyst structure 607 and element 605, surpass the Schottky barrier potential and enter the diode regions 601 and 604, forward biasing the diode and producing electric power.

The reversible nature of this embodiment is shown for illustration. The reaction stimulation properties of the same device may be its principle function, or the electrical generation properties may be the principle function.

Figure 7:
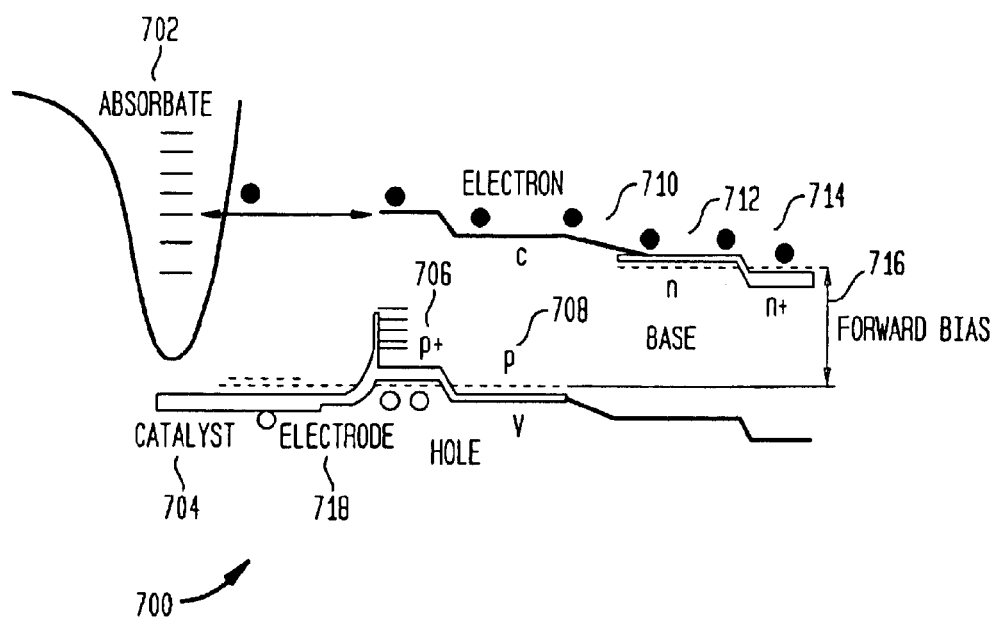

FIG. 7 illustrates the electronic energy levels diagram 700 of the elements of the solid state surface catalysis reactor device appropriate for the case where the hot carrier is a hot electron. These elements include an adsorbate 702, catalyst 704, positive electrode or electrical connection 718, electrode junction, highly doped semiconductor in the collector-emitter region 706, p doped semiconductor region 708, p-n junction region 710, n doped 712 and the heavily n doped 714 region.

In the stimulation mode, a forward bias 716 drives electrons from the n+ region 714 where they are majority carriers, into the p-n junction 710, into the p type region 708 of the semiconductor where they are minority carriers, into the catalyst 704, and then to the catalyst surface where they interact with the adsorbate 706. The hot electron excites states in the adsorbate which stimulate reactions.

In the generation mode, an energy decay path in the excited state of the adsorbate creates hot electrons on the catalyst surface; the hot electrons then travel through the catalyst to the p type semiconductor region and then continue to the p-n junction 710 where the internal electric fields in the semiconductor sweep them over to the n+ region 714, creating a forward bias, which becomes a source of electric power.

In this and all other embodiments, the effectiveness of the stimulator, generator and reactor may be enhanced by providing reactants in the gas phase. In this case, the adsorbates on the catalyst surface interact with the hot carriers. When a liquid covers the catalyst, multiple layers of adsorbate absorb the hot electron and diminish its effectiveness. In one embodiment, forward biased devices may be used for the purpose of reaction stimulation or electric generation.

While the invention has been particularly shown and described with respect to a preferred embodiment thereof, it will be understood by those skilled in the art that the foregoing and other changes in form and details may be made therein without departing from the spirit and scope of the invention. For example, those skilled in the art will appreciate that the features of the invention may sometimes be used to advantage without a corresponding use of the other features shown or described herein above. Similarly, some features may be combined, within the scope and equivalents of the present invention, to achieve a desired results.

We claim:

1. A solid state surface catalysis excitation transfer reaction apparatus comprising:
   a catalytic excitation collector; and
   an excitation emitter including a semiconductor diode whose at least one of excitations and band structure is coupled to at least one of excitations and band structure associated with the catalytic excitation collector,
   wherein one or more energies associated with reactions of adsorbates occurring in the catalytic excitation collector are converted into excitations and transported to the excitation emitter where emitter excitations are generated and converted into one or more forms of energy in the excitation emitter.

2. The apparatus as claimed in claim 1, wherein the reactions of adsorbates occur on a surface of the catalytic excitation collector.

3. The apparatus as claimed in claim 1, wherein the reactions of adsorbates occur with a surface of the catalytic excitation collector.

4. The apparatus as claimed in claim 1, wherein the one or more energies include one or more excited reactant molecular vibrations.

5. The apparatus as claimed in claim 1, wherein the one or more energies include one or more molecule-surface vibrations.

6. The apparatus as claimed in claim 1, wherein the one or more energies include one or more atom-surface vibrations.

7. The apparatus as claimed in claim 1, wherein the one or more energies include one or more adsorption reactions.

8. The apparatus as claimed in claim 1, wherein the one or more energies include one or more chemical reactions.

9. The apparatus as claimed in claim 1, wherein the one or more energies include one or more excited electronic states.

10. The apparatus as claimed in claim 1, wherein the excitations include one or more hot carriers.

11. The apparatus as claimed in claim 1, wherein the excitations include one or more electromagnetic fields.

12. The apparatus as claimed in claim 1, wherein the emitter excitations include one or more minority carriers.

13. The apparatus as claimed in claim 1, wherein the emitter excitations include one or more hot carriers.

14. The apparatus as claimed in claim 1, wherein the emitter excitations include energies transported by carrier diffusion.

15. The apparatus as claimed in claim 1, wherein the emitter excitations include the coupling electric fields which couple catalysts, adsorbates, conductors and semiconductors, the catalysts and adsorbates being elements that form the catalytic excitation collector, and the conductors and the semiconductors being elements that form the excitation emitter.

16. The apparatus as claimed in claim 1, wherein the emitter excitations include one or more excitons in the excitation emitter.

17. The apparatus as claimed in claim 1, wherein the emitter excitations include one or more of plasmons and evanescent fields on or near the surface of metals.

18. The solid state surface catalysis excitation transfer reaction apparatus as claimed in claim 1, wherein the catalytic excitation collector is in contact with the excitation emitter.

19. The apparatus as claimed in claim 1, wherein the semiconductor diode is forward biased.

20. The apparatus as claimed in claim 1, wherein the emitter excitations are created when the semiconductor diode becomes forward biased due to externally applied energy.

21. The apparatus as claimed in claim 20, wherein an electric potential applied across the semiconductor diode causes a forward bias in the semiconductor diode.

22. The apparatus as claimed in claim 20, wherein optical absorption of photons in the semiconductor diode causes the forward bias in the semiconductor diode.

23. The apparatus as claimed in claim 10, wherein the one or more hot carriers include one or more hot electrons.

24. The apparatus as claimed in claim 1, wherein the semiconductor diode includes a p-type excitation emitter region and an n-type base.

25. The apparatus as claimed in claim 1, wherein the semiconductor diode includes a highly doped p+ region.

26. The apparatus as claimed in claim 24, wherein the p-type emitter region is highly doped.

27. The apparatus as claimed in claim 1, wherein the semiconductor diode includes a highly doped n+ region.

28. The apparatus as claimed in claim 24, wherein the n-type base is highly doped.

29. The apparatus as claimed in claim 1, wherein the excitation emitter is fabricated from semiconductor material that includes any one or combination selected from In, Ga, As and Sb.

30. The apparatus as claimed in claim 1, wherein the excitation emitter is fabricated from semiconductor material that includes any one or combination selected from In, Sb, Bi, and Ti.

31. The apparatus as claimed in claim 1, wherein the excitation emitter is fabricated from semiconductor material that includes any one or combination selected from Hg, Cd, and Te.

32. The apparatus as claimed in claim 31, wherein a concentration of cadmium (Cd) is between 20% and 30%.

33. The apparatus as claimed in claim 1, wherein the semiconductor diode includes a p-n junction, a distance from the p-n junction to the catalytic excitation collector being less than three times a diffusion length of minority carriers in the semiconductor diode.

34. The apparatus as claimed in claim 1, where the catalytic excitation collector further includes:
a catalyst,
wherein total path traveled by energetic carriers between a catalyst surface exposed to adsorbate reactants and the semiconductor of the excitation emitter is less than three times the total mean free path associated with energy loss of the energetic carriers along the path.

35. The apparatus as claimed in claim 1, wherein the dimensions between the catalytic excitation collector and the excitation emitter are chosen to be small enough to permit predominantly ballistic carrier transport, which dimension is typically less than 3 times the effective mean free path associated with energy loss of the ballistic carriers.

36. The apparatus as claimed in claim 1, wherein the apparatus further includes an ohmic electrical connection connecting the catalytic excitation collector and the excitation emitter.

37. The apparatus as claimed in claim 1, wherein the apparatus further includes a tunneling Schottky junction connecting the catalytic excitation collector and the excitation emitter.

38. The apparatus as claimed in claim 34, wherein the catalyst includes one or more catalyst clusters.

39. The apparatus as claimed in claim 38, wherein the catalyst further includes one or more reaction accelerator-decelerator materials surrounding the one or more catalyst clusters.

40. The apparatus as claimed in claim 39, wherein the one or more reaction accelerator-decelerators include an oxide.

41. The apparatus as claimed in claim 40, wherein the oxide includes one selected from titanium, cerium, rare earth metals, tin, lead, and aluminum.

42. The apparatus as claimed in claim 40, wherein the oxide includes material of the catalyst.

43. The apparatus as claimed in claim 38, wherein the catalyst further includes one or more reaction accelerator-decelerator adjacent to the one or more catalyst clusters.

44. The apparatus as claimed in claim 38, wherein the catalyst further includes one or more reaction accelerator-decelerators in contact with the one or more catalyst clusters.

45. The apparatus as claimed in claim 34, wherein the catalyst has a Debye frequency less than the vibration decay frequency of the dominant mode of energy relaxation of at least one of adsorbate reactants.

46. The apparatus as claimed in claim 1, wherein the catalytic excitation collector includes a material having Debye temperature less than 500 degrees Kelvin.

47. The apparatus as claimed in claim 34, wherein the catalyst includes material selected from any one of Au, Ag, Pt, Pd, Cu, In, Fe, Ni, An, and Mo.

48. The apparatus as claimed in claim 34, wherein the catalyst is formed into metal clusters.

49. The apparatus as claimed in claim 34, wherein the catalyst is formed into a quantum confinement structure.

50. The apparatus as claimed in claim 1, wherein the catalytic excitation collector further includes at least one electrode underlayer metal formed between the excitation emitter and a catalyst in the catalytic excitation collector.

51. The apparatus as claimed in claim 50, wherein the electrode underlayer metal forms a substrate for one or more catalysts in the catalytic excitation collector.

52. The apparatus as claimed in claim 50, wherein the electrode underlayer metal forms a substrate for one or more reaction accelerator-decelerators in the catalytic excitation collector.

53. The apparatus as claimed in claim 50, wherein the electrode underlayer metal has a thickness less than three times energy mean free path of the excitations going through it.

54. The apparatus as claimed in claim 50, wherein an ohmic junction is formed between the electrode underlayer metal and the excitation emitter.

55. The apparatus as claimed in claim 50, wherein a tunneling Schottky junction is formed between the electrode underlayer metal and the excitation emitter.

56. The apparatus as claimed in claim 50, wherein an almost ohmic junction is formed between the electrode underlayer metal and the excitation emitter.

57. The apparatus as claimed in claim 1, wherein the apparatus further includes an optical cavity coupled to a region of adsorbate reactions.

58. The apparatus as claimed in claim 57, wherein the optical cavity is tuned to a selected energy level transition in at least one of the excitation and band structure of at least one of the excitation emitter, the catalytic excitation collector, and the adsorbate.

59. The apparatus as claimed in claim 57, wherein the optical cavity includes dielectric micro cavities.

60. The apparatus as claimed in claim 57, wherein the optical cavity stimulates emission of radiation.

61. The apparatus as claimed in claim 57, wherein the optical cavity stimulates energy transitions of at least one of the excitation and band structure of the excitation emitter.

62. The apparatus as claimed in claim 1, wherein the one or more forms of energy include pulsed energy.

63. The apparatus as claimed in claim 62, wherein the one or more forms of energy include pulsed electrical energy.

64. The apparatus as claimed in claim 62, wherein the one or more forms of energy include pulsed optical energy.

65. A method of converting adsorbate reaction energy into power, comprising:

coupling at least one of excitation and band structures of an adsorbate-catalyst into at least one of excitation and band structures of an excitation emitter;

optimizing the coupling to a diode in the excitation emitter; and converting one or more excitations in the diode to power.

66. The method of claim 65, wherein the coupling includes forming a catalytic excitation collector in the adsorbate-catalyst with one or more quantum confinement surface structures.

67. The method of claim 65, wherein the coupling includes tuning one or more optical cavities to a frequency of the at least one of excitation and band structures of at least one of the adsorbate-catalyst and the excitation emitter.

68. The method of claim 65, wherein the coupling includes forming a catalytic excitation collector in the adsorbate-catalyst and the optimizing includes constraining the thickness of a region between a surface of the catalytic excitation collector exposed to adsorbate reactants and the excitation emitter, the region having a thickness of less than three energy mean free paths of hot carriers exchanged between the catalytic excitation collector and the excitation emitter.

69. The method of claim 65, wherein the optimizing includes selecting a substrate with band gap energy less than or equal to a selected excitation in the adsorbate-catalyst.

70. The method of claim 65, wherein the optimizing includes adjusting a forward bias of the diode such that a band of excitation energy in the excitation emitter matches a band of excitation energies in the adsorbate-catalyst.

71. The method of claim 65, wherein the coupling includes selecting a catalyst with Debye frequency lower than a selected energy level of the one or more excitation structures of the adsorbate-catalyst system.

72. A method of converting reaction energy into power, comprising:

converting a fraction of the energy of one or more adsorbate reactants into hot carriers;

maintaining the hot carrier energy during hot carrier transport to a diode;

converting the hot carriers into a forward bias in the diode.

73. The method of claim 72, wherein the method further includes:

converting the hot carriers into minority carriers;

conveying the minority carriers to a p-n junction region of the diode; and generating a forward bias to generate power.

74. The method of claim 73, wherein the power includes electricity.

75. The method of claim 72, wherein the method further includes:

forming a population inversion by the hot carriers in the diode; and extracting optical energy.

76. The method of claim 75, wherein the extracting includes extracting by means of stimulated emission.

77. The method of claim 75, wherein the extracting includes extracting super-radiant emissions.

78. The method of claim 72, wherein the method further includes:

modifying one or more electron density of states of a material in a catalytic excitation collector to match a selected range of energy transitions of at least one of excitation and band structures of an adsorbate-catalyst system containing the adsorbate reactants.

79. The method of claim 78, wherein the modifying includes forming one or more catalyst monolayers.

80. The method of claim 78, wherein the modifying includes forming one or more ordered electron-reflective structures, also referred to as metal quantum wells and as Fabry-Pérot modes of quantum-well states, on a surface exposed to the adsorbate reactants.

81. The method of claim 78, wherein the modifying includes forming one or more ordered hole-reflective structures on a surface exposed to the adsorbate reactants.

82. The method of claim 78, wherein the modifying includes forming one or more hot electron Fabry-Perot modes of a thin-film electron interferometer.

83. The method of claim 78, wherein the modifying includes forming one or more catalyst monolayers.

84. The method of claim 78, wherein the modifying includes forming one to one hundred catalyst monolayers.

85. The method of claim 78, wherein the modifying includes forming one or more integer catalyst monolayers.

86. The method of claim 78, wherein the modifying includes forming one or more electron interferometer structures to cause a plurality of electron path reflections.

87. The method of claim 72, wherein the method further includes adding one or more expendable additives to the adsorbate reactants.

88. The method of claim 87, wherein the expendable additives include one or more catalyst materials.

89. The method of claim 87, wherein the expendable additives include one or more reaction accelerator-decelerator materials.

90. The method of claim 72, wherein the one or more adsorbate reactants have a partial pressure such that no more than one monolayer for each of the one or more adsorbate reactants accumulates during the surface reactions.

91. The method of claim 90, wherein the partial pressure is less than ten atmospheres.

92. The method of claim 72, wherein at least one of the adsorbate reactants is gaseous.

93. The method of claim 72, wherein the one or more adsorbate reactants include one or more decelerator materials.

94. The method of claim 72, wherein the one or more adsorbate reactants include one or more accelerator materials.

95. The method of claim 72, wherein the one or more adsorbate reactants include one or more hydrocarbon chains.

96. The method of claim 72, further including:

cooling the diode with a heat of vaporization of the one or more adsorbate reactants.

97. The method of claim 72, further including:

cleaning a catalyst by a reaction of the one or more adsorbate reactants.

98. A reversible solid state surface catalysis excitation transfer reaction apparatus comprising:

a catalytic excitation collector; and an excitation emitter whose excitation band structure is coupled to at least one of excitation and band structure associated with the catalytic excitation collector and its associated chemical adsorbates, wherein one or more energies associated with reactions of adsorbates associated with the catalytic excitation collector are converted into excitations and transported to the excitation emitter where emitter excitations are generated and converted into one or more forms of energy, and wherein energy applied to an excitation emitter creates emitter excitations, the emitter excitations transported to adsorbates in the catalytic excitation collector where the transported emitter excitations energize the excitations, the excitations causing reaction stimulation in the catalytic excitation collector.

99. The apparatus as claimed in claim 98, wherein the energy applied to the excitation emitter is pulsed electric power.

100. The apparatus as claimed in claim 98, wherein the reaction stimulation generates hot carriers.

101. The apparatus as claimed in claim 100, wherein the hot carriers further stimulate additional reactions.

102. A method of stimulating reactions, comprising:

providing a gas containing reactants to one or more catalyst surfaces of one or more excitation collectors in contact with one or more excitation emitters, wherein one or more of the reactants in the gas adsorb on a catalyst surface of an excitation collector;

creating hot carriers in an excitation emitter by applying energy to it, providing a means to transport the hot carriers of an excitation emitter to a surface of an excitation collector containing adsorbed reactants;

wherein the providing includes constraining the thickness properties of the one or more excitation collectors and one or more catalysts such that the hot carriers do not loose a substantial fraction of their energy while they are being transported.

103. The method of claim 102, wherein an electrical power pulse is applied to forward bias the diode.

104. The method of claim 102, wherein the power applied includes electrical power pulse with duration shorter than a lifetime of a longest lived excited state of the hot carriers.

105. The method of claim 102, wherein the power applied includes electrical power pulse with duration shorter than a lifetime of polariton states also referred to as localized excitations of a surface adsorbate.

106. The method of claim 102, wherein the power applied includes electrical power pulse with duration less than 1 nanosecond.

107. The method of claim 102, wherein the power applied includes electrical power pulse with duty cycle less than ½.

108. The method of claim 102, wherein the power applied includes electrical power pulse with repetition times comparable to or less than an average time during which gaseous reactants can replenish a surface of depleted reactants.

109. The method of claim 102, wherein the power applied includes electrical power pulse with repetition rate higher than 50 megahertz.

110. The method of claim 102, wherein the reactants have a partial pressure such that not more than one monolayer forms for each of the reactants on a surface of the catalyst material.

111. The method of claim 102, wherein at least one of the reactants is gaseous.

112. The method of claim 102, wherein the method further includes:

tailoring electron density of states of the catalytic excitation collector to approximately match a selected range of energy transitions of one or more excitation band structures of an adsorbate-catalyst system including the reactants.

113. The method of claim 112, wherein the modifying includes forming one or more catalyst monolayers.

114. The method of claim 112, wherein the modifying includes forming one or more ordered electron-reflective structures on the surface exposed to the reactants.

115. The method of claim 112, wherein the modifying includes forming one or more ordered hole-reflective structures on the surface exposed to the reactants.

116. The method of claim 112, wherein the modifying includes forming one or more hot electron Fabry-Perot modes of a thin-film electron interferometer.

117. The method of claim 112, wherein the modifying includes forming one or more catalyst metal monolayers.

118. The method of claim 112, wherein the modifying includes forming one to one hundred catalyst metal monolayers.

119. The method of claim 112, wherein the modifying includes forming one or more integer catalyst metal monolayers.

120. The method of claim 112, wherein the modifying includes forming one or more electron interferometer structures to cause a plurality of electron path reflections.

121. The method of claim 102, wherein the method further includes adding one or more expendable additives to the reactants.

122. The method of claim 121, wherein the expendable additives include one or more catalyst materials.

123. The method of claim 121, wherein the expendable additives include one or more reaction accelerator materials.

124. The method of claim 121, wherein the expendable additives include one or more reaction decelerator materials.

125. The method of claim 102, wherein the reactants include hydrocarbon chains.

126. The method of claim 102, wherein the reactants deposit one or more compounds on the catalytic excitation collector.

127. The method of claim 102, wherein the reactants include one or more compounds that form at least part of the catalytic excitation collector.

128. The method of claim 102, wherein reaction stimulated by the hot carriers cause a surface explosion.

129. The method of claim 102, wherein reaction stimulated by the hot carriers cause an autocatalyzed chain reaction.

130. The method of claim 102, further including cooling the diode with heat of vaporization of the reactants.

131. A solid state surface catalysis excitation transfer reaction apparatus comprising:

a catalytic excitation collector; and an excitation emitter whose excitation band structure is coupled to at least one of excitation and band structure associated with the catalytic excitation collector, wherein an energy applied to the excitation emitter creates one or more excitations, the excitations transported to reactants on the catalytic excitation collector, where the transported excitations energize excitations in reactants on or near the catalytic excitation collector, the excitations stimulating reactions.

132. The apparatus as claimed in claim 131, wherein the excitations include minority carriers.

133. The apparatus as claimed in claim 131, wherein the emitter excitations include hot carriers.

134. A solid state surface catalysis excitation transfer reaction apparatus comprising:

one or more catalytic excitation collectors; and an one or more excitation emitters whose at least one of excitation and band structures is coupled to at least one of excitation and band structures associated with one or more of the catalytic excitation collectors, wherein one or more pulses of excitation associated with reactions of adsorbates associated with a catalytic excitation collector are converted into one or more second excitations and transported to a collector where reactions are stimulated.

135. The apparatus of claim 134, wherein the reactants include one or more of gaseous reactants and adsorbates of the gaseous reactants.

136. The apparatus of claim 134, wherein the pulses of excitation include excited reactant molecular vibrations.

137. The apparatus of claim 134, wherein the reactions of adsorbates occur on a surface of a catalytic excitation collector.

138. The apparatus of claim 134, wherein the reactions of adsorbates occur with a surface of the catalytic excitation collector.

139. The apparatus of claim 134, wherein the emitter excitations include hot carriers.

140. The apparatus of claim 134, wherein the emitter excitations include minority carriers.

141. The apparatus of claim 140, wherein the one or more second excitations include hot carriers.

142. The apparatus as claimed in claim 1, wherein the excitations include energies transported by resonant tunneling.

143. The apparatus as claimed in claim 1, wherein the catalytic excitation collector further includes a catalyst, a material of the catalyst and an electrode of the p-n junction diode being one and the same.

144. The method of claim 70, wherein a hot carrier is an electron and the excitation band of the diode is its conduction band.

145. The method of claim 70, wherein a hot carrier is a hole and the excitation band of the diode is its valence band.

146. The method of claim 72, wherein the method further includes:

modifying one or more electron density of states of a material in a catalytic collector to match at least one of a selected excitation and band structure of an adsorbate-catalyst system having the adsorbate reactants.

147. The method of claim 78, wherein the tailoring includes forming one or more electron interferometer structures to cause a plurality of hole reflections.

148. A method of stimulating reactions, comprising:

applying power to a diode in an excitation emitter, the excitation emitter being in contact with a catalytic excitation collector;

creating hot carriers in the excitation emitter;

coupling excitation energy of the hot carriers to at least one of an excitation and band structure of the catalytic excitation collector by using resonant tunneling;

constraining the thickness properties of a coupling material of the catalytic excitation collector such that the resonant tunneling of the excitation energy experiences an energy transfer rate between excitation emitter and catalytic excitation collector not less than 3% of the competing, energy loss rates.

149. The method of claim 148, wherein the constraining the thickness properties includes constraining the thickness to less than 200 nanometer (nm) for a conducting coupling material of the catalytic excitation collector.

150. The method of claim 148, wherein the constraining the thickness properties includes constraining the thickness to less than 100,000 nanometer (nm) for a non-conducting coupling material of the catalytic excitation collector.

151. A method of claim 102, wherein the creating hot carriers includes energizing a two terminal device of an excitation emitter by applying electrical energy.

152. A method of claim 151, wherein the two terminal device includes one or more of a diode, semiconductor diode, metal-insulator-metal device, or a conductor-semiconductor-conductor device.

153. A method of claim 102, wherein the applying energy to an excitation emitter includes applying pulses of energy.

154. A method of claim 153, further including constraining the duration of the pulses to less than 50 picoseconds.

155. A method of claim 102, wherein the applying energy to an excitation emitter includes applying pulses of energy with high peak power and low average power.

156. A method of claim 155, further including using a ratio of peak to average power that exceeds 10.

* * * * *